(12) United States Patent　　(10) Patent No.:　US 6,914,446 B1
Tustaniwskyj et al.　　(45) Date of Patent:　Jul. 5, 2005

(54) CHIP TESTER HAVING A HEAT-EXCHANGER WITH AN EXTENDABLE PERIOD OF OPERATION

(75) Inventors: Jerry Ihor Tustaniwskyj, Mission Viejo, CA (US); James Wittman Babcock, Escondido, CA (US)

(73) Assignee: Unisys Corporation, Blue Bell, PA (US)

( * ) Notice: Subject to any disclaimer, the term of this patent is extended or adjusted under 35 U.S.C. 154(b) by 148 days.

(21) Appl. No.: 10/625,064

(22) Filed: Jul. 22, 2003

(51) Int. Cl.[7] .............................................. G01R 31/02
(52) U.S. Cl. ................................. 324/760; 324/158.1
(58) Field of Search ............................. 324/755, 760, 324/765, 158.1; 165/80.2, 80.3, 80.4, 80.5; 257/713, 717–719; 219/209, 250–254; 361/701, 709

(56) References Cited

U.S. PATENT DOCUMENTS 4,297,775 A * 11/1981 Butt et al. ............. 29/890.039
5,821,505 A * 10/1998 Tustaniwskyj et al. ..... 219/494
5,864,176 A * 1/1999 Babock et al. .............. 257/714
6,636,062 B2 * 10/2003 Gaasch et al. .............. 324/760

* cited by examiner

Primary Examiner—Minh N. Tang
(74) Attorney, Agent, or Firm—Charles J. Fassbender; Mark T. Starr; Lise A. Rode

(57) ABSTRACT

A chip tester includes a heat-exchanger which regulates the temperature of an integrated circuit chip that is being tested by pressing against the chip. The heat-exchanger incorporates an electric heater and a heatsink that are joined together with a layer of attach material. The layer of attach material is limited to one that can be melted, at least partially, at a predetermined temperature, and re-solidified, multiple times. A spacer is in the heat-exchanger which stays solid at the predetermined temperature and which keeps the layer of attach material at a constant thickness.

15 Claims, 12 Drawing Sheets

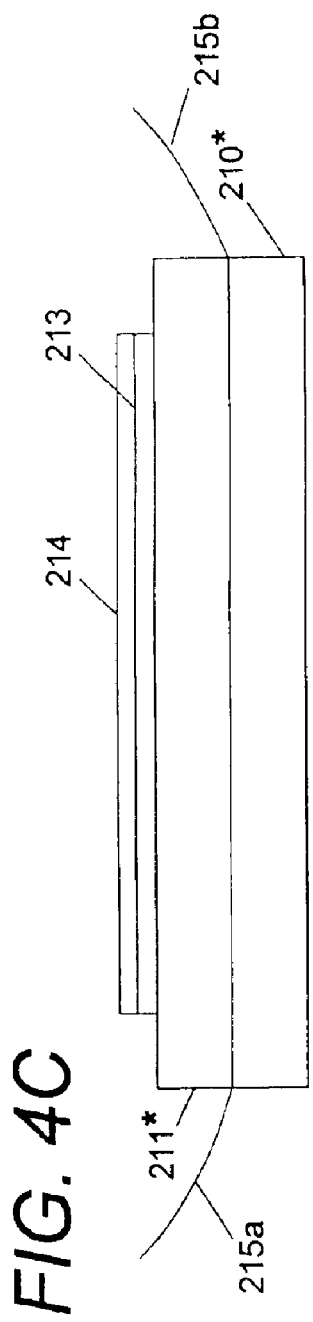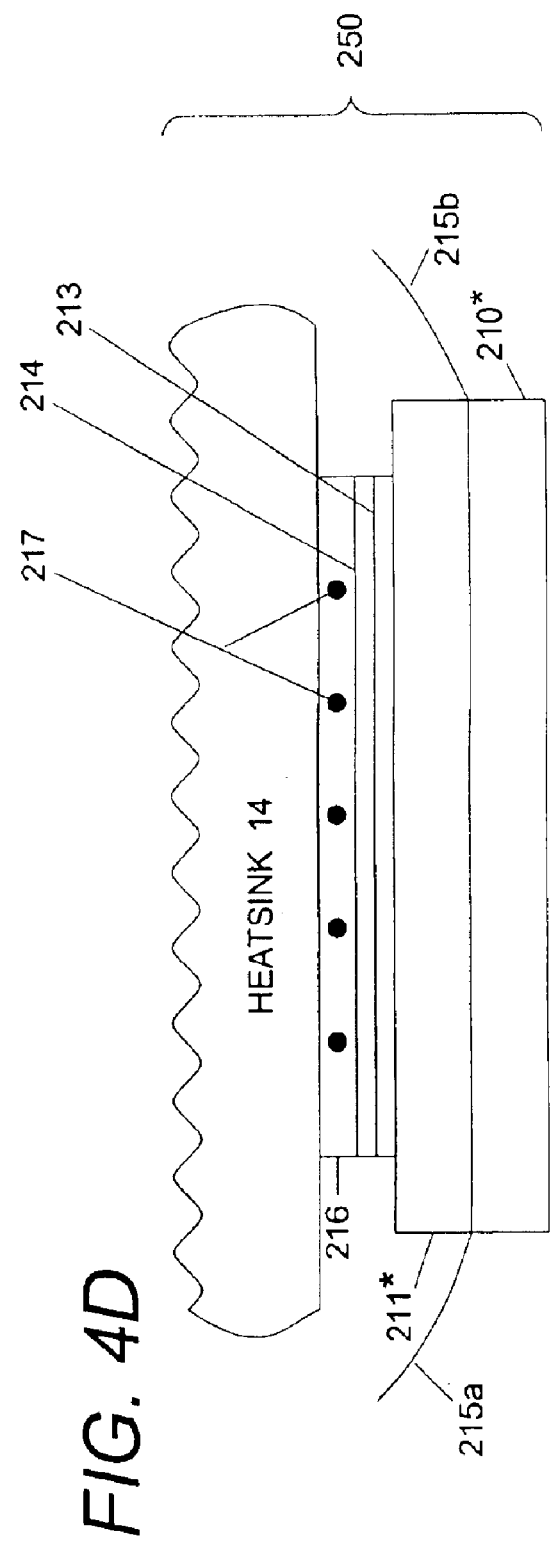

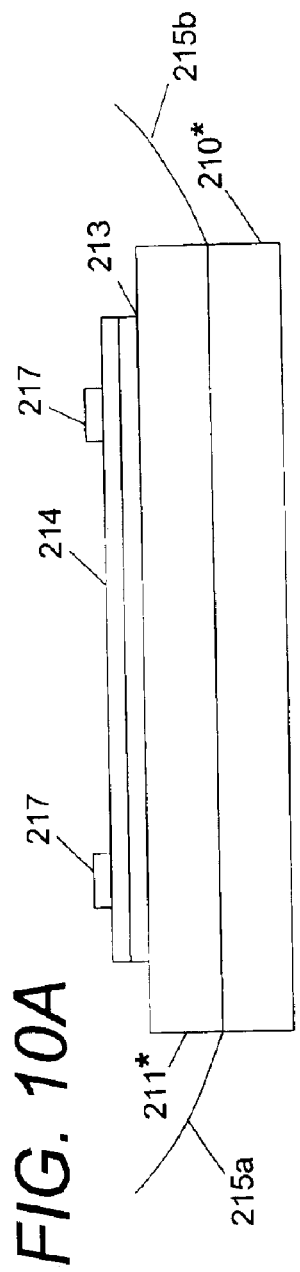
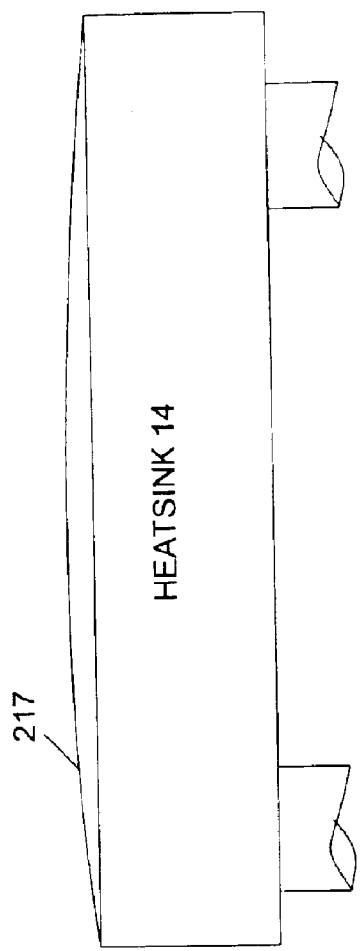
FIG. 10A
FIG. 10B

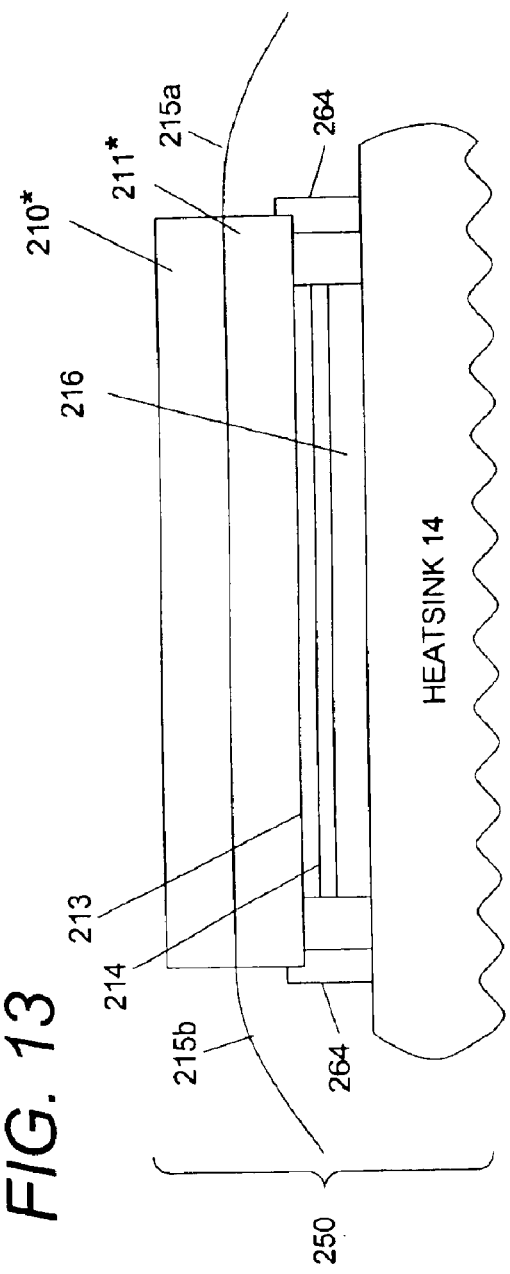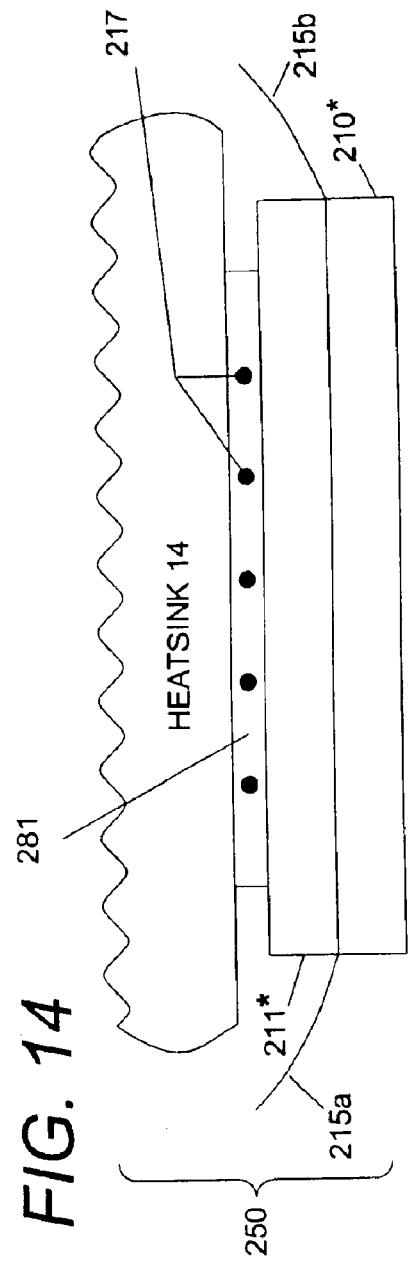

CHIP TESTER HAVING A HEAT-EXCHANGER WITH AN EXTENDABLE PERIOD OF OPERATION

RELATED CASES

The present invention is related to another invention having U.S. Ser. No. 10/625,051 which is entitled "METHOD OF EXTENDING THE OPERATIONAL PERIOD OF A HEAT-EXCHANGER IN A CHIP TESTER". U.S. patent applications on the present invention and the above identified related invention were co-filed on Jul. 22, 2003, and they have a common Detailed Description.

BACKGROUND OF THE INVENTION

The present invention relates to chip testers. More particularly, the present invention relates to chip testers which have a heat-exchanger that include an electric heater and a heatsink that are joined together with a layer of attach material.

Within the chip tester, the heat-exchanger contacts an integrated circuit chip and maintains the chip's temperature near a set point while the chip is tested. A prior art chip tester which has a heat-exchanger with an electric heater and a heatsink is disclosed in U.S. Pat. No. 5,821,505.

For ease of reference, FIG. 1 of the '505 patent is reproduced herein as FIG. 1 and labeled prior art. In that figure, reference numeral 11 identifies the integrated circuit chip which is to be tested while its temperature is maintained near the set point. The chip 11 may be packaged in ceramic or plastic, or it may be unpackaged.

The chip 11 has dozens of input/output terminals, and some of those terminals are shown in FIG. 1 as being coupled to the signal lines 12a, 12b, and 12c. "TEST-IN" signals are received by the chip 11 on the signal lines 12a; "TEST-OUT" signals are sent by the chip 11 to the signal lines 12b; and "TEMP" signals are sent by the chip 11 to the signal lines 12c. The TEMP signals indicate the temperature of the chip 11, and they originate from a temperature sensor which is integrated into the chip 11.

All of the remaining components 12–17 in FIG. 1 comprise a portion of the chip tester which keeps the temperature of the chip 11 near the set point while that chip is being tested. Each component 12–17 is described in TABLE 1 of patent '505, which is reproduced below.

TABLE 1

| COMPONENT | DESCRIPTION |
| --- | --- |
| 12 | Component 12 is a printed circuit board which physically holds the components 11, 16, 17 and 18. Also, the printed circuit board 12 contains several sets of signal and power lines 12a–12g. |
| 13 | Component 13 is a thin, flat electric heater which has two major faces 13a and 13b that lie against components 11 and 14 respectively. A variable amount of electrical power $P_h$ is supplied to the heater 13 via two wires 13c, and that power is dissipated as heat within the heater. One embodiment of the heater 13 is comprised of aluminum nitride ceramic in which electrical resistors (not shown) are uniformly integrated for converting the power from the conductors 13c to heat. |
| 14 | Component 14 is a liquid cooled heatsink that has a hollow base 14a in which cooling fins (not shown) are disposed. A liquid coolant 14b enters the base 14a from a tube 14c, and that liquid coolant exits the base via another tube 14d. This coolant 14b is circulated through the base 14a at a constant flow rate by a pump (not shown) and held at a constant temperature $T_L$. |
| 15 | Component 15 is an electronic control circuit which sends the variable amount of electrical power $P_h$ to the electric heater 13. This control circuit 15 consists of a power regulator 16 and a variable power supply 17. |
| 16 | Component 16 is a power regulator which is coupled to three sets of signal lines 12c, 12d, and 12e. The TEMP signals which indicate the present temperature $T_d$ of the chip 11 are received on the signal lines 12c, and SET-POINT signals which indicate the set point temperature for the chip 11 are received on the signal lines 12d. Based on those two temperatures and their rate of change, power regulator 16 generates control signals CTL on the signal lines 12e which indicate the amount of power that should be sent to the heater 13 such that the temperature of the chip 11 stays near the set point. |
| 17 | Component 17 is a variable power supply which is coupled to the signal lines 12e and two sets of power lines 12f and 12g. On the signal lines 12e, the control signals CTL from the power regulator 16 are received, and on the power lines 12f, a supply voltage +V and ground are received. In response to the CTL signals, the power supply 17 sends the variable amount of power $P_h$ on the power lines 12g as a portion of the power which is available from the supply voltage +V. |
| 18 | Component 18 is a connector which intercouples the heater wires 13c to the variable power supply. |

In operation, the chip 11 is tested by sending it the TEST-IN signals on the signal lines 12a, and by examining the chip's response via the TEST-OUT signals on the signal lines 12c. While that occurs, the power dissipation in the chip 11 varies because many transistors within the chip 11 turn-on and turn-off whenever the TEST-IN and TEST-OUT signals change. As the power dissipation of the chip 11 increases the chip temperature tends to increase; and vise-versa.

The TEMP signals from the chip 11 are sent on the signal lines 12c to the power regulator 16 where they are compared to the SET-POINT signals on the signal lines 12d. When the temperature of the chip 11 is too cold relative to the set point temperature, then the regulator 16 increases the heater power $P_h$ via the control signals CTL. Conversely, when the temperature of the chip 11 is too hot relative to the set point temperature, then the regulator 16 decreases the heater power $P_h$.

Due to the above described operation of the power regulator 16, the testing of just a single chip typically subjects the heater 13 to thousands of different changes in temperature. Thus, as multiple chips are tested in the FIG. 1 chip tester over time, the total number of temperature changes to which the heater 13 is subjected can easily exceed one million.

The present inventors have closely analyzed the above temperature changes in the FIG. 1 tester to see if they have any long term adverse effect on the tester. What the present inventors found is that as the number of chips which have been tested increases, the thermal resistance increases through an epoxy layer which joins the heater 13 to the heatsink 14. This epoxy layer is shown and described as item 102 in FIG. 18 of the '505 patent, and that figure is reproduced herein as FIG. 2.

Further the present inventors have determined from their analysis that the above increase in thermal resistance is caused by microscopic stress cracks that are induced in the epoxy layer 102 when the heater 13 is subjected to a large number of temperature changes while multiple chips 11 are tested. These stress cracks are schematically shown in FIG. 3 where they are indicated by reference numeral 200. The present inventors have determined that the stress cracks 200 occur because the heater 13 and the heatsink 14 expand at different rates when the above temperature changes occur.

The presence of the stress cracks 200 is a serious problem because they eventually cause the thermal resistance through the epoxy layer 102 to become so large that the temperature of the chip 11 cannot be kept at the set point. When that occurs, the entire heat-exchanger (i.e.,—the heater 13 and the attached heatsink 14) needs to be removed from the tester and replaced. But replacing the entire heat-exchanger is expensive, and it also causes downtime on the chip tester.

Accordingly, a primary object of the present invention is to provide a novel structure for a heat-exchanger in a chip tester, which completely avoids the above need to replace the heat-exchanger.

BRIEF SUMMARY OF THE INVENTION

To avoid the need to replace a heat-exchanger in a chip tester, the heat-exchanger incorporates an electric heater and a heatsink that are joined together with a particular structure (which is claimed herein). In one preferred embodiment, the electric heater and heatsink are joined with a layer of attach material which can be melted and re-solidified, multiple times, and metal balls are embedded in that layer which stay solid while the attach material is melted.

Initially in the chip tester which incorporates the above heat-exchanger, multiple chips are tested in a manner which subjects the heat-exchanger to many temperature changes, all of which stay below the melting temperature $T_M$ of the attach material. Due to these temperature changes the layer of attach material remains solid, and stress cracks are eventually induced in the layer.

Next the heat-exchanger is subjected to a crack-healing temperature cycle in which the layer of attach material is melted and re-solidified. While the layer is melted, force is applied to the heater and the heatsink which urges them towards each other. That force is opposed by the metal balls in the layer of attach material which act as spacers that keep the thickness of the layer constant and prevents the melted attach material from being squeezed out.

In the re-solidified layer of attach material, all of the stress cracks are eliminated. Thus, the heat-exchanger with the re-solidified layer of attach material can be used again in the chip tester to test additional chips.

Several additional embodiments of the heat-exchanger are disclosed and claimed herein. In one embodiment, the metal ball spacers are replaced with metal rings or wires. In another embodiment, the spacers are bumps that are fabricated on the heatsink and extend through the layer of attach material to the electric heater. In still another embodiment, the spacers are projections which are fabricated on the heatsink and extend around the layer of attach material to the electric heater.

BRIEF DESCRIPTION OF THE DRAWINGS

FIG. 4C shows a third step of fabricating a heat-exchanger in accordance with the present invention.

FIG. 4D shows a final step of fabricating a heat-exchanger in accordance with the present invention.

FIG. 10A shows a modification for the heat-exchanger of FIG. 4D.

FIG. 10B shows a second modification for the heat-exchanger of FIG. 4D.

FIG. 13 shows a fifth modification for the heat-exchanger of FIG. 4D.

FIG. 14 shows a sixth modification for the heat-exchanger of FIG. 4D.

DETAILED DESCRIPTION

In order to avoid the heat-exchanger replacement problem which is described in the BACKGROUND, a heat-exchanger that has a particular structure must be employed. Now, the details of how to fabricate one preferred embodiment of a heat-exchanger which has such a structure will be described with reference to FIGS. 4A–4D. Thereafter, the details of how microscopic stress-cracks in the heat-exchanger of FIG. 4D are eliminated by subjecting that heat-exchanger to a particular crack-healing temperature cycle, will be described with reference to FIGS. 5–6.

Figure 4A:
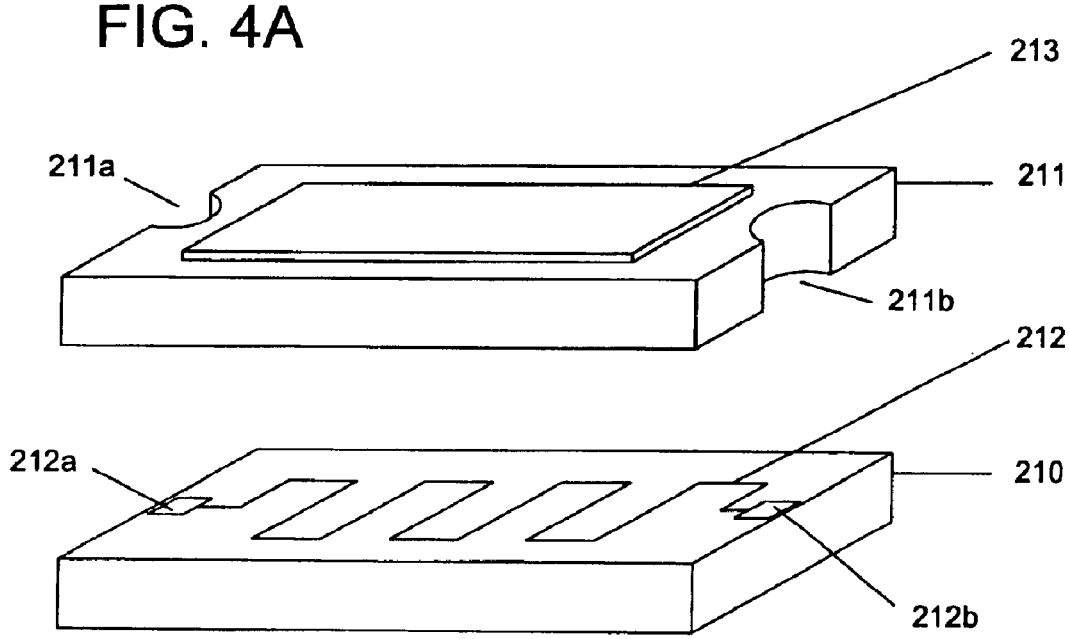
FIG. 4A shows an initial step of fabricating a heat-exchanger in accordance with the present invention.

In FIG. 4A, items 210 and 211 are flat layers of uncured (green) ceramic. A series of several electrical resistors 212 are screen printed in a uniform pattern on one face of the green ceramic layer 210. Also screen-printed are a pair of input/output pads 212a and 212b for the series of resistors.

The perimeter of the green ceramic layer 211 has two notches 211a and 211b which expose the input/output pads 212a and 212b. Also, on one face of the green ceramic layer 211, a metal layer 213 is screen-printed. This metal layer 213 is limited to one which will not melt and will not oxidize when the green ceramic layers are cured. The metal layer 213 can be made of tungsten, or molybdenum, for example.

Figure 4B:
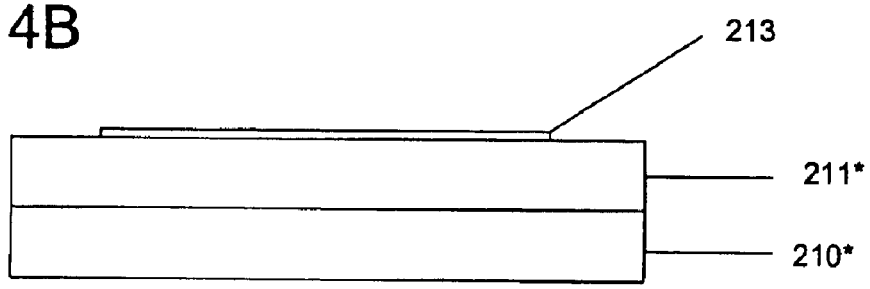
FIG. 4B shows a second step of fabricating a heat-exchanger in accordance with the present invention.

While all of the components 210–213 are oriented as shown in FIG. 4A, the two green ceramic layers are pressed together, and then all of the components 210–213 are co-fired. This cures the green ceramic, and forms an integrated structure. A side view of that integrated structure is shown in FIG. 4B. There, the cured ceramic layers are identified as 210* and 211*.

Thereafter, a metal layer 214 is deposited on top of the metal layer 213. This is shown in FIG. 4C. Suitably, the depositing is done by electroplating, or electroless plating. The metal 214 is limited to one that is easily wetted by solder. For example, the metal layer 214 can be made of nickel.

Later, electrical wires 215a and 215b are connected to the input/output pads 212a and 212b of the series of resistors. These wires 215a and 215b are also shown in FIG. 4C.

Thereafter, a layer of solder 216, which has embedded spacers 217, is deposited on the metal layer 214. Then the solder layer 216 with the embedded spacers 217 is attached to a heatsink, such as the heatsink 14 in FIG. 1. The resulting structure is the heat-exchanger 250 that is shown in FIG. 4D.

In the above attachment step, the solder layer 216 together with the embodied spacers 217 is squeezed between the metal layer 214 and the heatsink 14, while the solder layer 216 is melted and re-solidified. When the solder 216 is in the melted state, the spacers 217 keep the heatsink 14 and the metal layer 214 separated, and thus they set the thickness of the re-solidified solder layer 216. In one embodiment, the spacers 217 consist of several metal balls. In another embodiment, the spacers 217 consist of metal rings or metal wires.

In subsequent processing steps, the electrical wires 215a and 215b preferably remain connected to their input/output pads 212a and 212b. This can be achieved by making the solder layer 216 with a solder that has one particular melting point, and attaching the electrical wires 215a and 215b to their input/output pads with a different solder that has a higher melting point.

Figure 1:
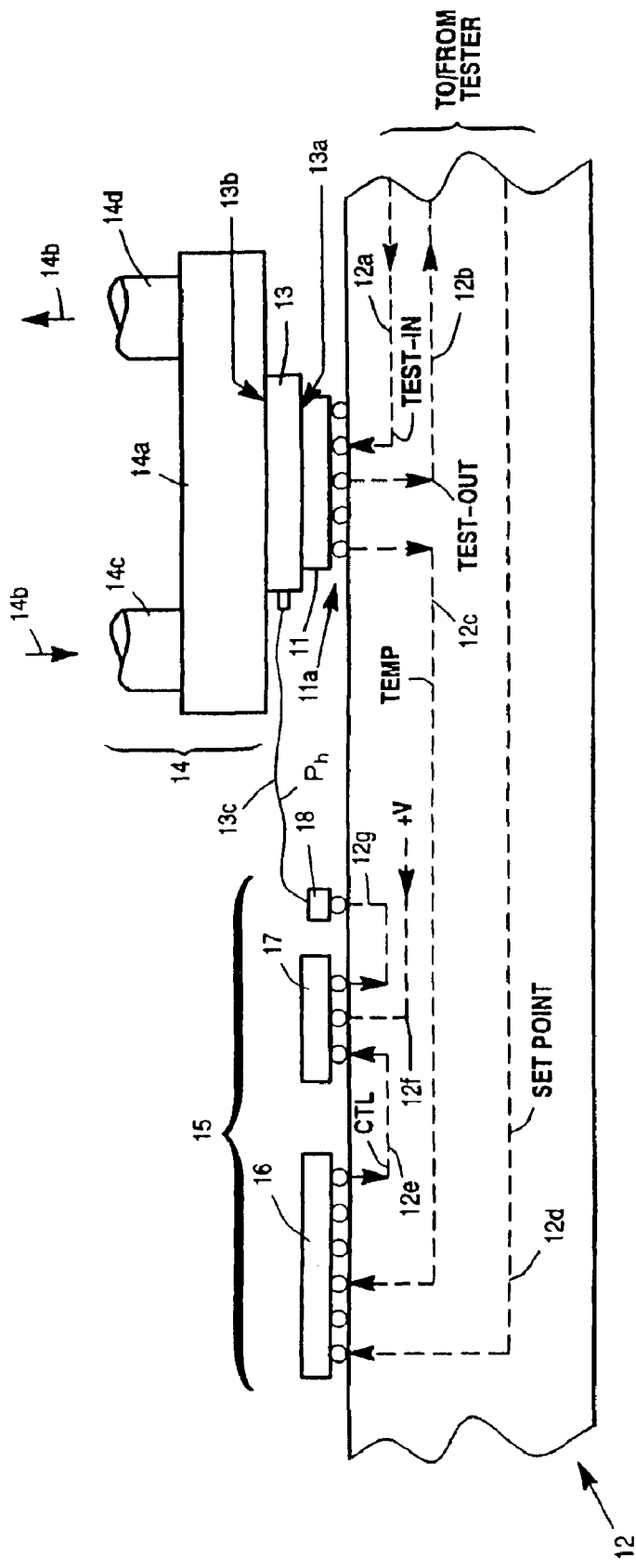
FIG. 1 shows a portion of a prior art chip tester that has a technical problem which the present invention overcomes.
Figure 2:
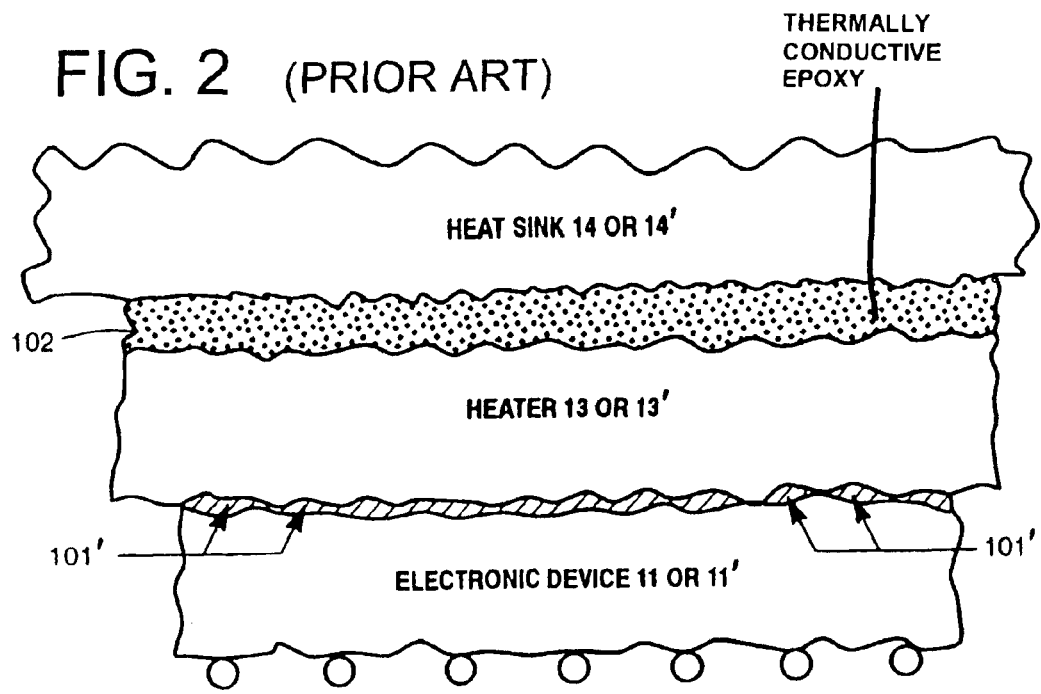
FIG. 2 shows additional details of a heat-exchanger which is in the FIG. 1 chip tester.
Figure 3:
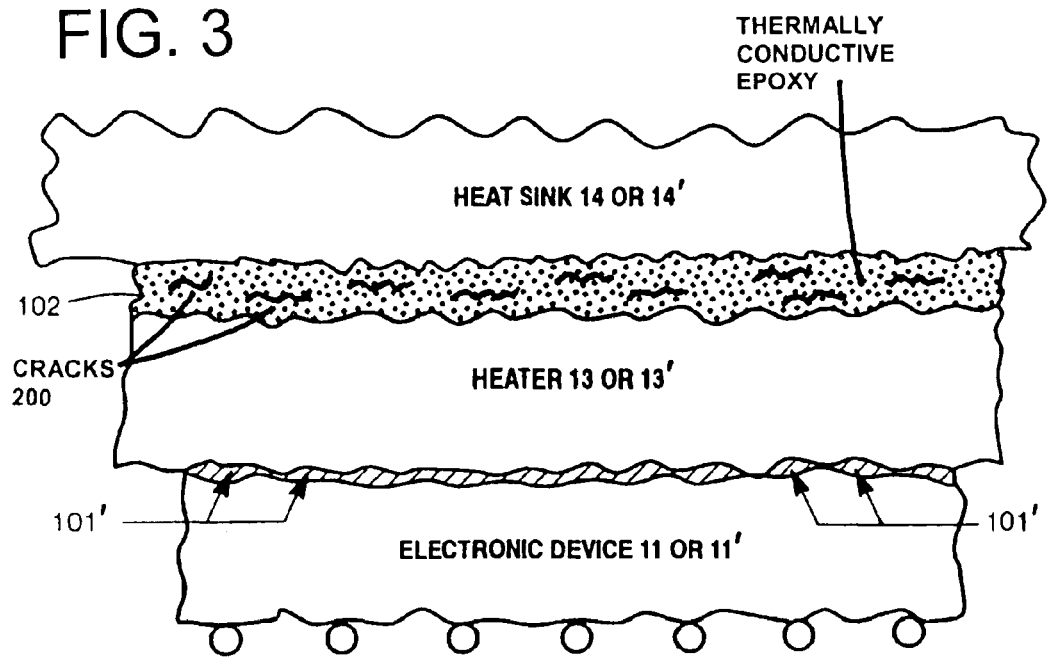
FIG. 3 shows microscopic stress cracks in the FIG. 2 heat-exchanger, which get induced when that heat-exchanger is subjected to temperature changes while multiple chips are tested.
Figure 5:
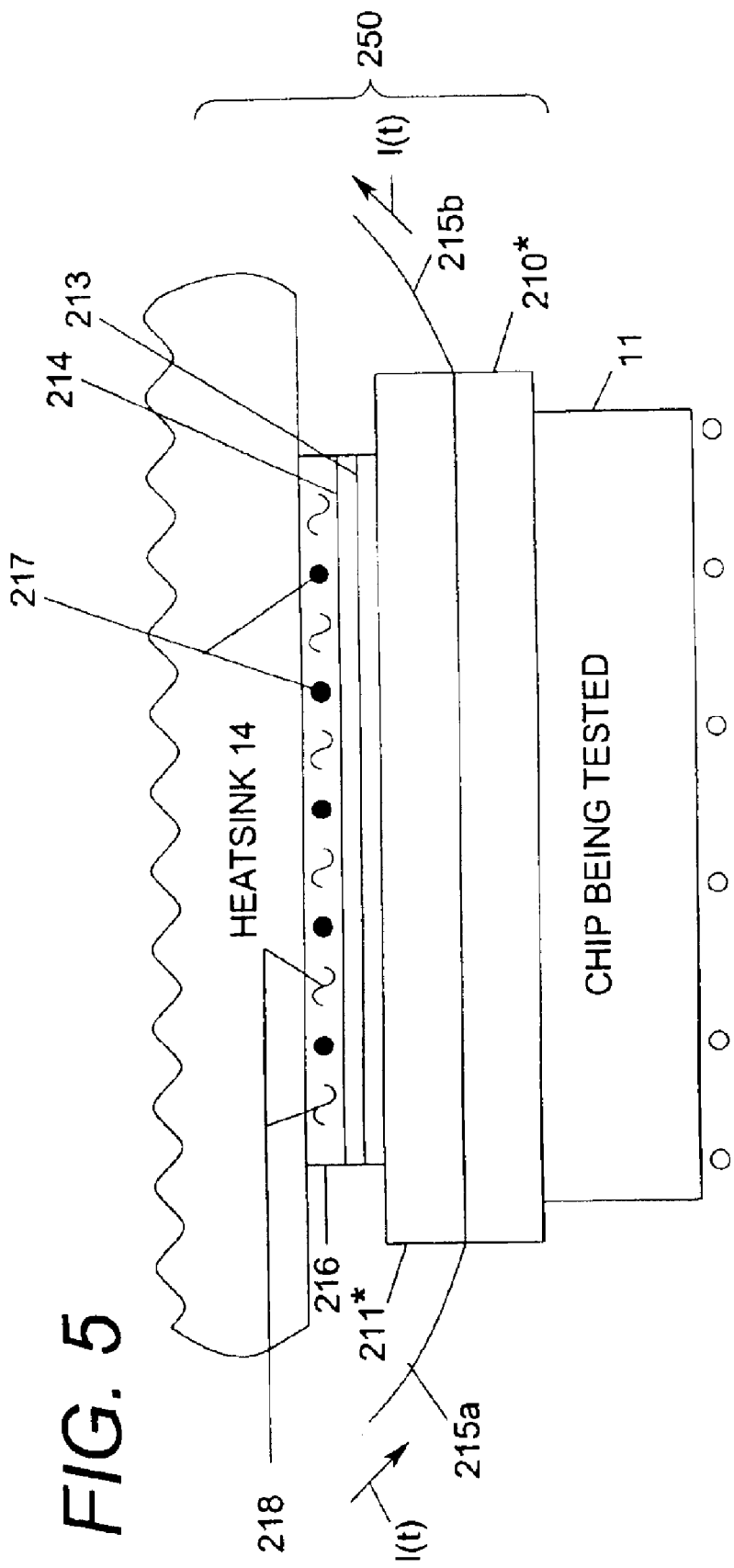
FIG. 5 shows where microscopic stress cracks get induced in the heat-exchanger of FIG. 4D when that heat-exchanger is subjected to temperature changes while multiple chips are tested.

After the heat-exchanger 250 of FIG. 4D is completely fabricated, it is installed in a chip tester, such as the chip tester of FIG. 1. Then, multiple chips are sequentially tested in the chip tester while the heat-exchanger 250 is used to maintain the temperature of each chip 11 near a set-point. This is done by sending a varying current I(t) through the wires 215a and 215b as shown in FIG. 5.

When the temperature of the chip 11 is too cold relative to the set-point, then the magnitude of the current I(t) is increased. Conversely, when the temperature of the chip 11 is too hot relative to the set-point, then the magnitude of the current I(t) is decreased. However, all of these changes eventually induce microscopic stress cracks in the solder layer 216, and those cracks are schematically indicated in FIG. 5 by reference numeral 218.

Now with reference to FIG. 6, one preferred process for removing the stress cracks 218 will be described. Throughout this process, the heat-exchanger 250 remains in the chip tester.

Initially, at time t1, the chip 11 that was last tested is replaced in the chip tester with a dummy member 11*. This dummy member 11* has the same physical dimensions as the chip 11, and so it presses against the heat-exchanger 250 in the chip tester just like the chip 11.

Thereafter at time t2, the flow of liquid coolant through the heatsink 14 is stopped. The flowing liquid coolant was previously indicated in FIG. 1 by a pair of arrows 14b. Also, if the coolant is of a type that vaporizes below the melting point of the solder layer 216, then preferably that coolant is removed from the heat-exchanger 250.

Subsequently, at time t3, an electric current I(t) is sent through the wires 215a and 215b. Here, the magnitude of the current I(t) is controlled such that enough heat is dissipated in the resistors 212 to raise the temperature of the solder layer 216 above its melting point. When the solder layer 216 is in the melted state, the spacers 217 keep the thickness of that layer constant.

After the solder layer 216 has melted, all current through the wires 215a and 215b is stopped. This occurs at time t4. Then the solder layer 217 cools and re-solidifies. In the re-solidified solder layer 217, there are no stress cracks, as is shown in FIG. 6.

Thereafter at time t5, the flow of liquid coolant through the heat-exchanger 250 is resumed. Later at time t6, the dummy member 11* is removed from the chip tester. Then, the heat-exchanger 250 of FIG. 6 is used in the chip tester to regulate the temperature of more chips while they are tested.

Preferably, the spacers 217 have a diameter in the range of four to twenty mils. If the spacers 217 have a smaller diameter, the solder layer 216 will be so thin that the stress cracks 218 will occur too frequently.

Figure 6:
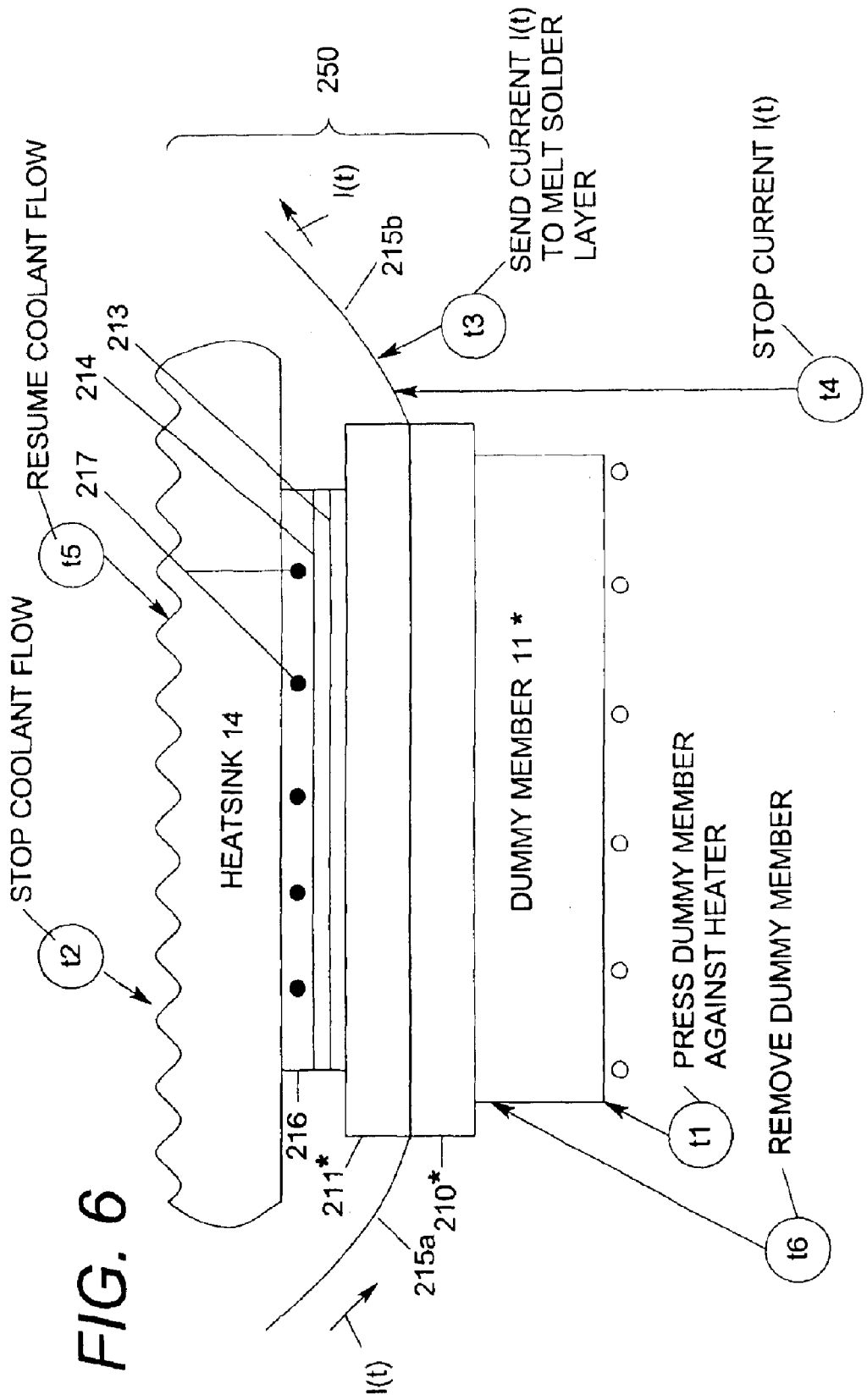
FIG. 6 shows the details of one particular crack-healing temperature cycle by which the stress cracks in the FIG. 5 heat-exchanger are eliminated.

One important feature of the above described method of FIG. 6 is that the entire replacement cost of a new heat-exchanger 250 is saved. Also, another important feature of the method of FIG. 6 is that downtime on the chip tester is greatly reduced in comparison to that which would occur if the heat-exchanger 250 had to be replaced.

Next, an alternative method will be described for removing the stress cracks 218 from the heat-exchanger 250 in FIG. 5. This alternative method is shown in FIG. 7.

Figure 7:
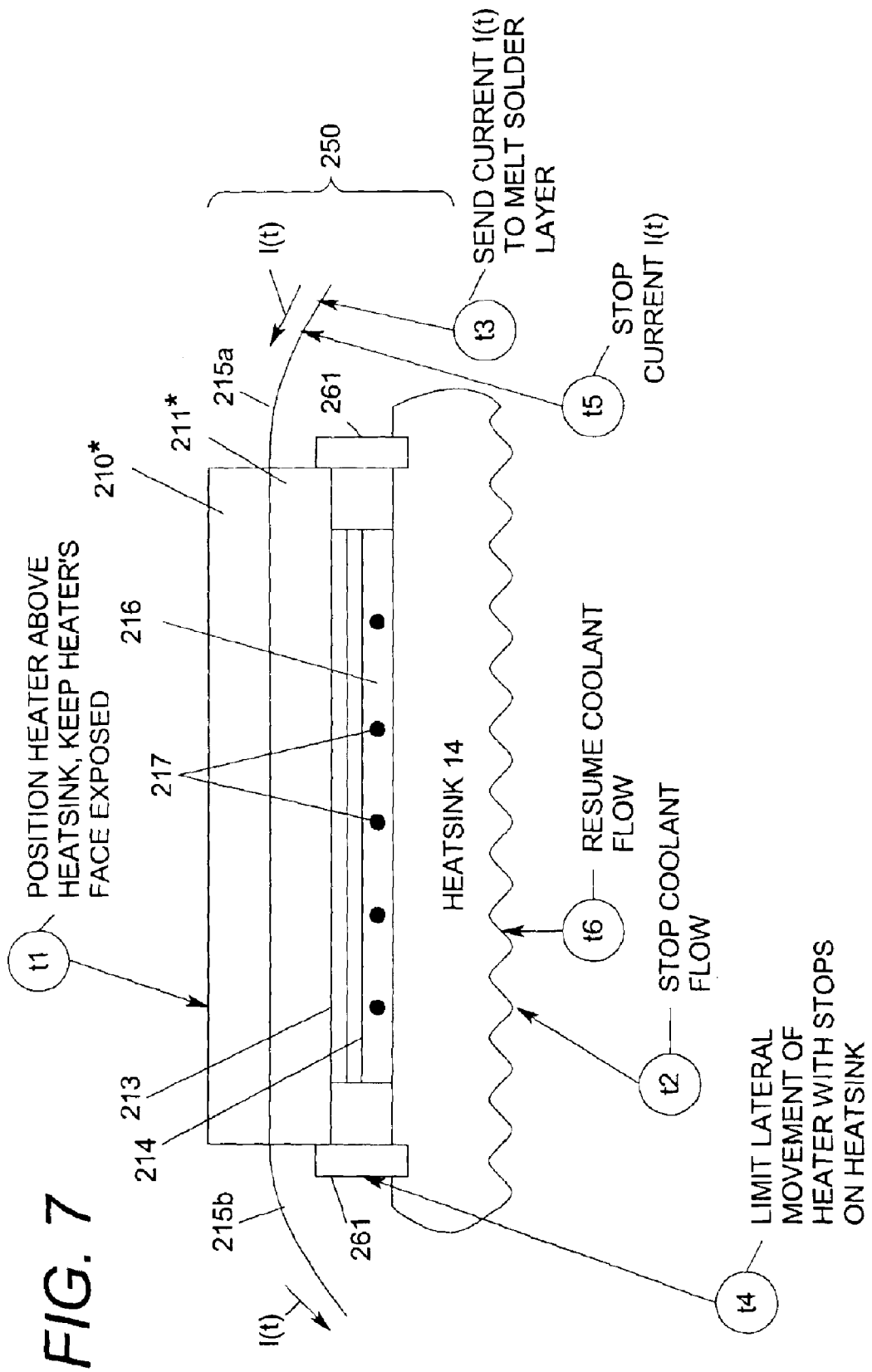
FIG. 7 shows the details of a second particular crack-healing temperature cycle by which the stress cracks in the FIG. 5 heat-exchanger are eliminated.

Initially in FIG. 7 the heat-exchanger 250 is oriented such that—a) the electric heater lies above the heatsink, and b) the electric heater is not in contact with any chip or dummy member. This step occurs at time t1 in FIG. 7. There, the heatsink is item 14, and the face of the electric heater which is not in contact with any chip or dummy member is the top of the cured ceramic layer 210*.

To orient the electric heater above the heatsink, the entire heat-exchanger 250 can be removed from the chip tester and placed with the proper orientation on a workbench. Alternatively, the chip tester may be structured such that it always holds the electric heater above the heatsink. In that case, the entire method of FIG. 7 can be performed while the heat-exchanger 250 is in the tester, just like the method of FIG. 6.

At time t2 in FIG. 7, the flow of liquid coolant through the heatsink 14 is stopped. Here again, if the coolant is of a type that vaporizes below the melting point of the solder layer 216, then preferably that coolant is removed from the heat-exchanger 250.

Subsequently, at time t3, an electric current I(t) is sent through the wires 215a and 215b. The magnitude of this current I(t) is controlled such that enough heat is dissipated in the resistors 212 to raise the temperature of the solder layer 216 above its melting point. When the solder layer 216 is in the melted state, gravity exerts a downward force on the electric heater but the spacers 217 keep the thickness of the solder layer 216 constant.

Also in the method of FIG. 7, several stops 261 are positioned around the perimeter of the electric heater. These stops 261 limit the lateral movement of the electric heater while the solder layer 216 is in the melted state. The step of limiting the lateral movement of the electric heater with stops 261 occurs in FIG. 7 at time t4. The stops 261 are held in place by the heatsink 14 as shown in FIG. 7.

After the solder layer 216 has melted, all current through the wires 215a and 215b is stopped. This occurs at time t5. Then the solder layer 216 cools and re-solidifies. In the re-solidified solder layer 216, there are no stress cracks, as is shown in FIG. 7.

Thereafter, the flow of liquid coolant through the heat-exchanger 250 is resumed. Then, the heat-exchanger 250 of FIG. 7 is used in the chip tester to regulate the temperature of more chips while they are tested.

Next, another alternative method will be descried for removing the stress cracks 218 from the heat-exchanger 250 in FIG. 5. This alternative method is shown in FIG. 8.

Figure 8:
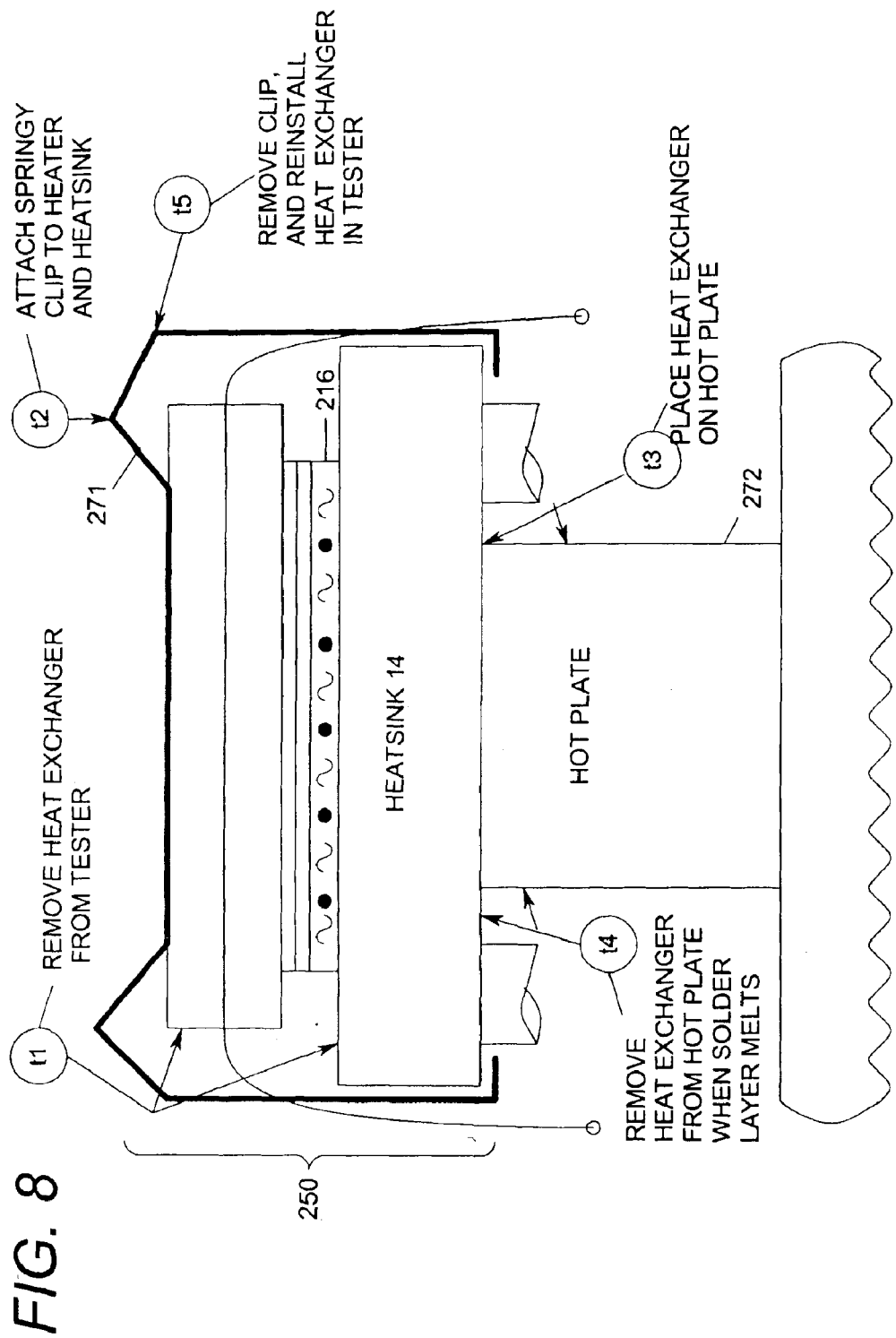
FIG. 8 shows the details of a third particular crack-healing temperature cycle by which the stress cracks in the FIG. 5 heat-exchanger are eliminated.

Initially in FIG. 8, the heat-exchanger 250 is removed from the chip tester. This occurs in FIG. 8 at time t1.

Thereafter, a springy clip 271 is attached to the heat-exchanger 250 such that the clip 271 squeezes the heatsink and the electric heater towards each other. This occurs in FIG. 8 at time t2.

Subsequently, the heat-exchanger 250 with the attached clip 271 is placed on a hotplate 272. This occurs at time t3 in FIG. 8.

While the heat-exchanger 250 with the attached clip 271 is on the hotplate 272, the temperature of the hotplate is controlled such that enough heat is transferred to the heat-exchanger to melt the solder layer 216. Then, while the solder layer 216 is in a melted state, the heat-exchanger 250 with the attached clip 271 is removed from the hotplate 272 and cooled. This occurs at time t4 in FIG. 8.

During all of the time that the solder layer 216 is in the melted state, the springy clip 271 and the spacers 217 prevent the electric heater from moving relative to the heatsink. Thereafter, when the solder layer 216 re-solidifies, the thickness of that layer is unchanged and the stress-cracks 218 are eliminated. Thus the heat-exchanger 250 is then re-installed into the chip tester and used to regulate the temperature of more chips while they are tested.

Three different methods for extending the operational period of heat-exchanger in a chip tester have now been described in detail. Now, various modifications which can be made to these details will be described.

Figure 9:
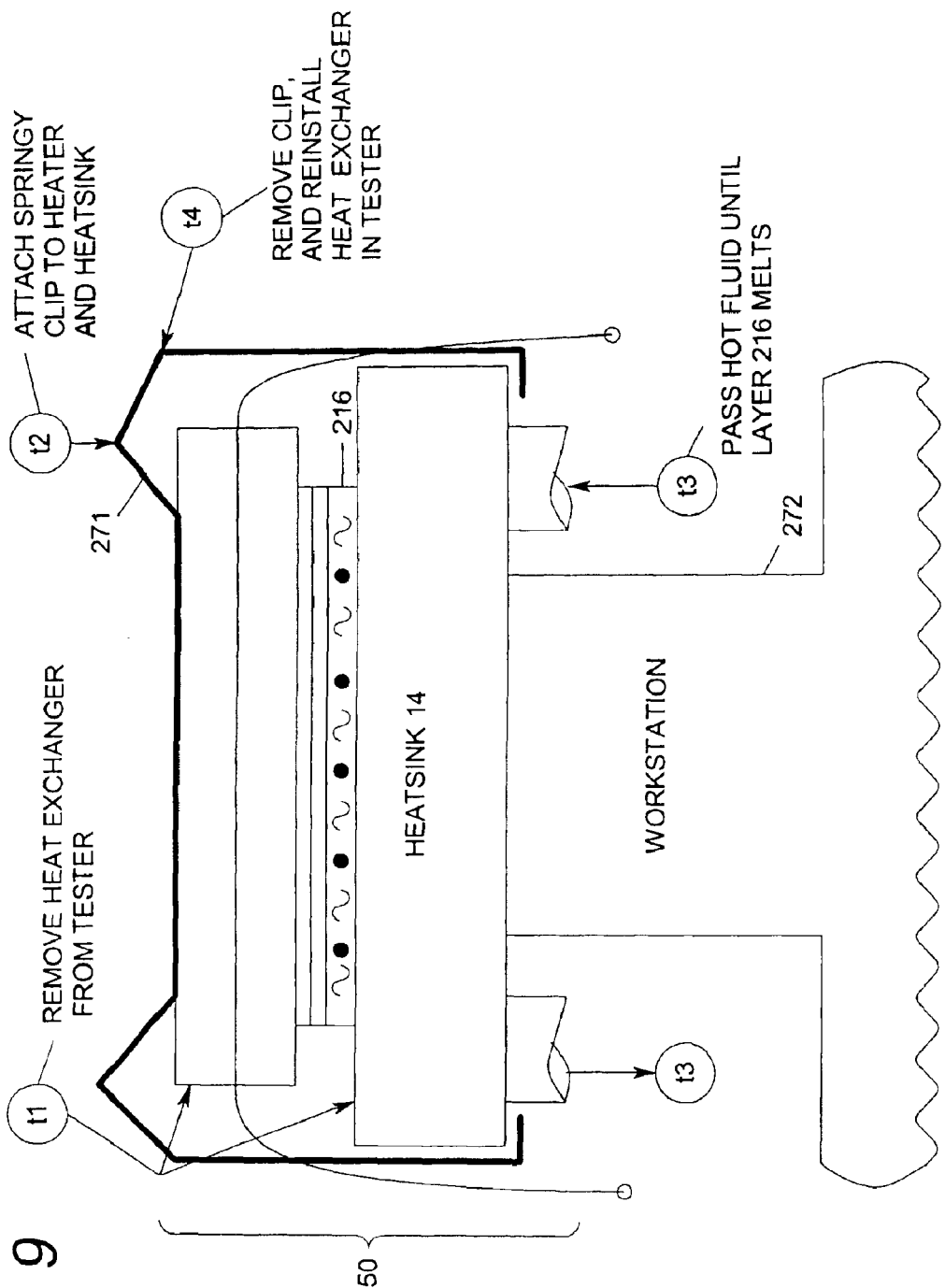
FIG. 9 shows a modification to the crack-healing temperature cycle of FIG. 8.

The first modification will be described with reference to FIGS. 8 and 9. In FIG. 8, the solder layer 216 is melted by transferring heat from the hotplate 272 to the heat-exchanger 250. However, as a modification, the solder layer 216 can be melted by passing a hot fluid through the heatsink 14. This modification is shown in FIG. 9.

The next modification will be described with reference to FIGS. 4D, 10A, and 10B. In FIG. 4D, the heat-exchanger 250 is constructed with spacers 217 in the solder layer 216, and the spacers were described as metal balls or metal rings or metal wires. However, as a modification, the spacers 217 can be one or more projections 217 which are fabricated on the surface of the metal layer 214 in the electric heater, or on the surface of the heatsink 14, and go through the solder layer 216.

One example of this modification is shown in FIG. 10A wherein several cylindrical projections 217 are fabricated on the electric heater. A second example is shown in FIG. 10B wherein a single convex projection 217 is fabricated on the heatsink 14 A heat-exchanger which has the projections 217 shown in FIGS. 10A and 10B can be incorporated into the method steps of FIGS. 5, 6, and 7. Also, the cylindrical projections 217 in FIG. 10A can be incorporated onto the heatsink 14, and the convex projection of FIG. 10B can be incorporated onto the metal layer 214 of the electric heater.

Figure 11:
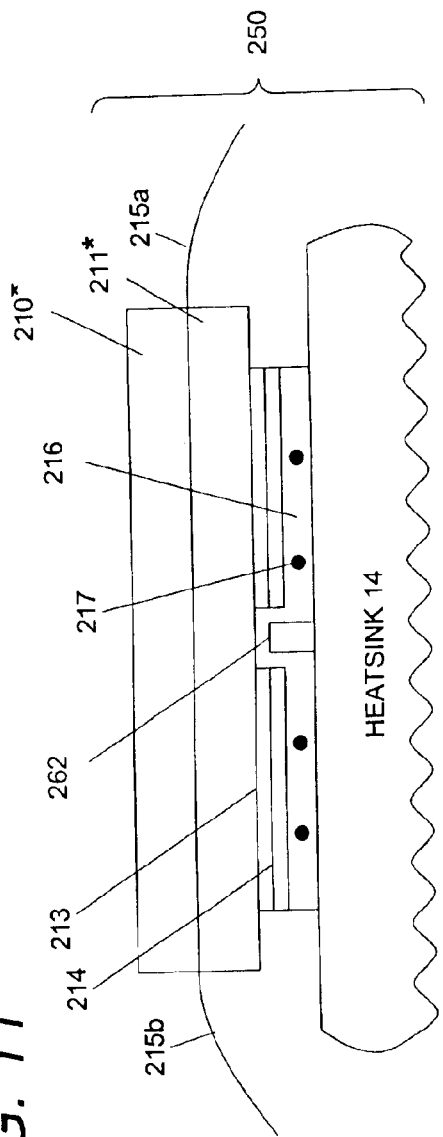
FIG. 11 shows a third modification for the heat-exchanger of FIG. 4D.

The next modification will be described with reference to FIGS. 7 and 11. In FIG. 7, several stops 261 are provided which limit the lateral movement of the electric heater relative to the heatsink when the solder layer 216 is melted. The stops 261 in FIG. 7 are located around the perimeter of the electric heater. However as an alternative, a single stop 262 can be provided which extends from the heatsink through the solder layer 216 and into a hole in the center of the metal layer 214 in the electric heater. This modification is shown in FIG. 11. Similarly, a single stop can be provided which extends from the electric heater through the solder layer 216 and into a hole in the center of the metal layer 214 in the heatsink.

Figure 12:
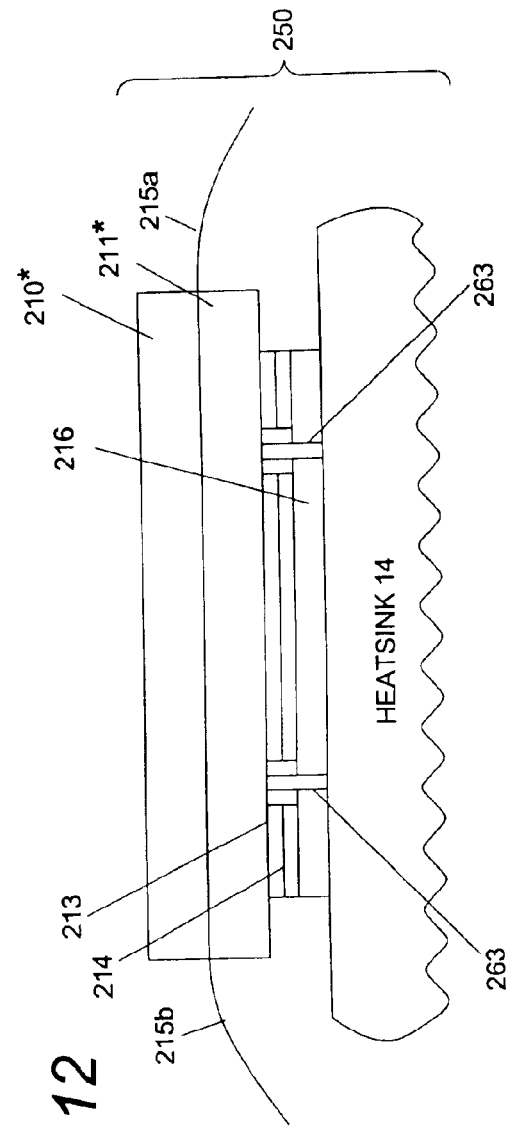
FIG. 12 shows a fourth modification for the heat-exchanger of FIG. 4D.

The next modification will be described with reference to FIGS. 11 and 12. In FIG. 11, the thickness of the attach layer 216 is set by the spacers 217, and the lateral movement of the heatsink 14 relative to the electric heater is limited by the stop 262. However as a modification, several projections 263 can extend from the heatsink 14, as shown in FIG. 12, where each projection operates as both a spacer and a stop. Each projection 262 extends through the attach layer 216 and through a hole in the metal layers 213 and 214. Then each projection 262 pushes against the ceramic layer 211*.

As an alternative, several projections 264 can extend from the heatsink 14, as shown in FIG. 13. There, each projection 264 operates as both a spacer and a stop, which does not extend through the attach layer 216. Instead, the projections 264 of FIG. 13 extend from the heatsink 14 around the attach layer 216. Also, as a variation, the projections 263 of FIG. 12 or 264 of FIG. 13 can be fabricated on layer 214 of the electric heater and extend therefrom to the heatsink 14.

The next modification will be described with reference to FIGS. 4D and 14. In FIG. 4D, three separate layers 213, 214, and 216 lie between the heatsink 14 and the cured ceramic layer 211* in the electric heater. However, as a modification, the three separate layers 213, 214, and 216 can be replaced with a single layer of a material 281 that—a) will attach directly to the heatsink 14 and the cured ceramic layer 211* in the electric heater, b) has a high thermal conductivity, and c) can be melted and re-solidified multiple times. This modification is shown in FIG. 14. One particular example of the material 281 is the metal Indium. Another example of the material 281 is a thermoplastic, such as polyethylene loaded with silver flakes.

As another modification, the layer of attach material 216 or 281 need not be one which changes from a solid state directly to a liquid state. Instead, the layer of attach material can change from a solid state to a slurry state (where it is only partially melted) before becoming completely liquid.

Thus, the crack-healing temperature cycles (which are described above in conjunction with FIGS. 6, 7, 8, and 9) may be carried out by heating the layer of attach material to a temperature where that layer is only partially melted.

As another modification, in FIG. 4A, a temperature sensor which has a pair of input/output terminals can be added to the green ceramic layers 210 or 211. Similar, the temperature sensor and its input/output terminals can be put on a separate green ceramic layer and co-fired with the layers 210 and 211.

As another modification, in FIG. 4C, the electrical wires 215a and 215b that are shown need not be soldered directly to the input/output pads 212a and 212b of FIG. 4A. Instead, input/output pins can be soldered to the input/output pads, and the wires can subsequently be wrapped onto the pins or attached thereto with a pin connector.

As still another modification, in FIG. 6, the coolant flow through the heatsink 14 need not be stopped at time t2 if the current I(t) at time t3 is still able to melt the solder layer 216. Also, if the coolant is kept flowing, the coolant may be warmed by an external heater or mixed with a hot fluid while the current I(t) melts the solder layer 216 at time t3.

As yet another modification, in FIG. 8, the heat-exchanger can be placed in a belt furnace or an oven at time t3 (instead of on a hotplate), and removed therefrom at time t4. Alternatively, in FIG. 8, any external heat source can be used to melt the solder layer in the heat-exchanger.

In view of the above, it is to be understood that the present invention is not limited to just the details of any one preferred version that is illustrated, but is defined by the appended claims.

What is claimed is:

1. A chip tester of the type that includes a heat-exchanger which regulates the temperature of an integrated circuit chip that is being tested by pressing against the chip, said heat-exchanger being comprised of an electric heater and a heatsink that are joined together with a layer of an attach material; characterized in that:

said layer of attach material is limited to one that can be melted, at least partially, at a predetermined temperature, and re-solidified, multiple times; and, a spacer is in said heat-exchanger which stays solid at said predetermined temperature and maintains said layer of attach material at a constant thickness.

2. A chip tester according to claim 1 wherein said spacer is comprised of several metal balls which are embedded in said layer.

3. A chip tester according to claim 1 wherein said spacer is comprised of one or more metal rings which are embedded in said layer.

4. A chip tester according to claim 1 wherein said spacer is comprised of one or more metal wires which are embedded in said layer.

5. A chip tester according to claim 1 wherein said spacer is comprised of one or more projections which extend from said electric heater through said layer to said heatsink.

6. A chip tester according to claim 1 wherein said spacer is comprised of one or more projections which extend from said heatsink through said layer to electric heater.

7. A chip tester according to claim 1 wherein said spacer is comprised of several projections which extend from said electric heater around said layer to said heatsink.

8. A chip tester according to claim 1 wherein said spacer is comprised of several projections which extend from said heatsink around said layer to electric heater.

9. A chip tester according to claim 1 which further includes multiple stops that extend from said heatsink around said electric heater.

10. A chip tester according to claim 1 which further includes multiple stops that extend from said electric heater around said heatsink.

11. A chip tester according to claim 1 which further includes at least one stop that extends from said heatsink through said layer of attach material into a hole in said electric heater.

12. A chip tester according to claim 1 which further includes at least one stop that extends from said electric heater through said layer of attach material into a hole in said heatsink.

13. A chip tester according to claim 1 wherein said electric heater includes a cured layer of ceramic with a first metal layer on said cured ceramic layer and a second metal layer on said first metal layer, and said layer of attach material is a solder which attaches said second metal layer directly to said heatsink.

14. A chip tester according to claim 1 wherein said electric heater includes a cured layer of ceramic, and said layer of attach material is a metal which attaches said cured ceramic layer directly to said heatsink.

15. A chip tester according to claim 1 wherein said electric heater includes a cured layer of ceramic, and said layer of attach material is a thermoplastic which attaches said cured ceramic layer directly to said heatsink.

* * * * *